United States Patent
Hansen (10) Patent No.: US 10,530,387 B1
(45) Date of Patent: Jan. 7, 2020

(54) ESTIMATING AN OPTIMAL ORDERING FOR DATA COMPRESSION

(71) Applicant: Uber Technologies, Inc., San Francisco, CA (US)

(72) Inventor: Bob Hansen, Pittsburgh, PA (US)

(73) Assignee: Uber Technologies, Inc., San Francisco, CA (US)

( * ) Notice: Subject to any disclaimer, the term of this patent is extended or adjusted under 35 U.S.C. 154(b) by 0 days.

(21) Appl. No.: 16/167,469

(22) Filed: Oct. 22, 2018

(51) Int. Cl.
  *H03M 7/30* (2006.01)
  *G06N 20/00* (2019.01)
  *H03M 7/00* (2006.01)
  *G06F 16/174* (2019.01)

(52) U.S. Cl.
  CPC .......... *H03M 7/3062* (2013.01); *G06N 20/00* (2019.01); *H03M 7/3071* (2013.01); *G06F 16/1744* (2019.01)

(58) Field of Classification Search
  CPC .............. H03M 7/3062; H03M 7/3071; G06F 16/1744
  USPC ..................................... 341/50, 51, 106, 107
  See application file for complete search history.

(56) References Cited

U.S. PATENT DOCUMENTS

| | | | |
|---|---|---|---|
| 6,542,199 B1* | 4/2003 | Manbeck | G11B 27/031 348/441 |
| 10,085,027 B2* | 9/2018 | Tu | H04N 19/14 |
| 2016/0373767 A1* | 12/2016 | Yang | H04N 19/174 |
| 2017/0060956 A1* | 3/2017 | Akoglu | H04L 63/1425 |

* cited by examiner

*Primary Examiner* — Peguy Jean Pierre
(74) *Attorney, Agent, or Firm* — Fenwick & West LLP (57) ABSTRACT

A system orders a set of objects to be optimally compressed using techniques such as delta encoding which compress data by saving differences between sequential objects. In one embodiment, the system determines transition costs associated with transitioning from each object in the set to each other object in the set. The system determines an ordering of the objects that minimizes a total of all the transition costs and compresses the set in the determined order. In another embodiment, the system determines an estimated optimal ordering for data compression. The system extracts feature values from the objects and applies a projection function to the feature values to generate scalar representations of the objects, for example, by projecting the feature values onto a space filling curve. An ordering of the scalar values for the objects determines an ordering for compressing the objects.

17 Claims, 7 Drawing Sheets

| | Preceding Image 210 | | | | |
|---|---|---|---|---|---|
| Next Image 220 | ∅ | A | B | C | D |
| A | 100 | ∅ | 21 | 11 | 31 |
| B | 100 | 20 | ∅ | 10 | 11 |
| C | 100 | 10 | 11 | ∅ | 21 |
| D | 100 | 30 | 10 | 20 | ∅ |

ESTIMATING AN OPTIMAL ORDERING FOR DATA COMPRESSION

BACKGROUND

Field of Art

This disclosure relates generally to data compression, and more particularly to determining an estimated optimal order for encoding a data set.

Description of Art

Some data compression schemes work best when the data is ordered in a particular way prior to compression. For example, techniques such as delta encoding, in which differences in sequential objects are saved rather than the objects themselves, compress sets of data objects most efficiently when the data is ordered in a way that minimizes a total cost of transitioning through all of the objects, and thus saving storage space or limiting the cost needed to transmit the compressed data. However, determining an optimal order for compressing a data set can sometimes require an unreasonable amount of time, memory space, or computing power.

SUMMARY

A system estimates an optimal order in which to compress objects in a data set. In one embodiment, the system generates transition cost values for transitions among objects in the data set. The transition cost values are used to determine a data sequence for which a total of the transition cost values is minimized.

In another embodiment, the system estimates an optimal order for compressing the objects in a data set using values associated with features of the objects. A projection algorithm is applied to the feature values extracted from each object in the set to determine a scalar value that represents the object with respect to the other objects in the set. For example, by projecting n feature values onto an n-dimensional space filling curve that preserves spatial locality, the objects with similar features can be assigned similar scalar values based on their projected distance along the space filling curve. The system may also use computer models trained on optimal orderings of data sets to determine weighting values that emphasize features which have a greater effect on generating a good estimated ordering using the projection algorithms.

The features and advantages described in this summary and the following detailed description are not limiting and are not all-inclusive. Many additional features and advantages will be apparent to one of ordinary skill in the art in view of the drawings, specification, and claims hereof.

BRIEF DESCRIPTION OF THE DRAWINGS

Figure (FIG. 1 is a high-level block diagram of a system architecture of a compression system, in accordance with an embodiment.

The figures depict an embodiment of the invention for purposes of illustration only. One skilled in the art will readily recognize from the following description that alternative embodiments of the structures and methods illustrated herein may be employed without departing from the principles of the invention described herein.

DETAILED DESCRIPTION

Delta encoding is a technique for compressing or encoding data by describing sequential objects with respect to differences between the objects. This disclosure describes a system that develops and applies a near-optimal ordering for compressing a data set using delta encoding. Although examples described herein relate to compression of a set of images, such a system could be used to compress data sets in different formats (e.g., text, video, audio, etc.).

The system initially obtains a data set for compression. The system develops a cost matrix that includes values representative of costs to transition between objects in the data set. For example, a cost could be represented by the number of pixels that need to be changed to convert one image in the data set to another image in the data set. As an additional example, a transition cost could be determined by applying a compression algorithm to only these two images to identify the size of the resulting compression. Such costs may represent the relative expense to determine a subsequent image from a prior image and could translate to a loss of efficiency, a use of computing resources, or a requirement of additional storage space in memory. In one embodiment, the cost matrix is represented as a weighted, directed graph, wherein the costs for transitioning from one image to another image represent the weights between nodes in the graph, and an algorithm for identifying an ordering that minimizes, or nearly minimizes, a total cost of transitioning through all of the images (i.e., an ordering that visits or traverses all nodes in the graph) is applied to the graph. That is, the system determines an order for compressing the images when a compression scheme compresses images based on changes from one image to the next. In other embodiments, the cost matrix may be expressed as a dense matrix or as a sparse matrix.

Generating an order to save image data can be computationally intensive. In some cases, it may be computationally infeasible to determine an optimal ordering as a number of images for storage is increased. To more quickly and cost-effectively order data sets for delta encoding, the system extracts feature values associated with objects from the data set, for example, red-green-blue color percentages for individual images. Information about values associated with features of each object is mapped onto a linear space, for example, via a space-filling curve or another model. The images may then be compressed by the system in the order specified by their positions in the linear space, for example in the order of their projections along the space-filling curve.

To determine a compression order without directly evaluating transition costs, the system generates weights associated with each feature and the weights are used to adjust the feature inputs to a model or projection algorithm that converts the feature inputs into a representative scalar value. The system learns appropriate weights to apply to the features based on models of important features in data training sets. For example, data sets of images with labeled feature values that have been ordered for efficient delta encoding may be used to learn weighting values. That is, images that have already been ordered for compression based on the cost of transition between subsequent images may be used to train a model to predict appropriate feature weights. In one embodiment, a developer or system administrator may further manually adjust weighting values to apply to the features input to the projection algorithm.

Figure 1:
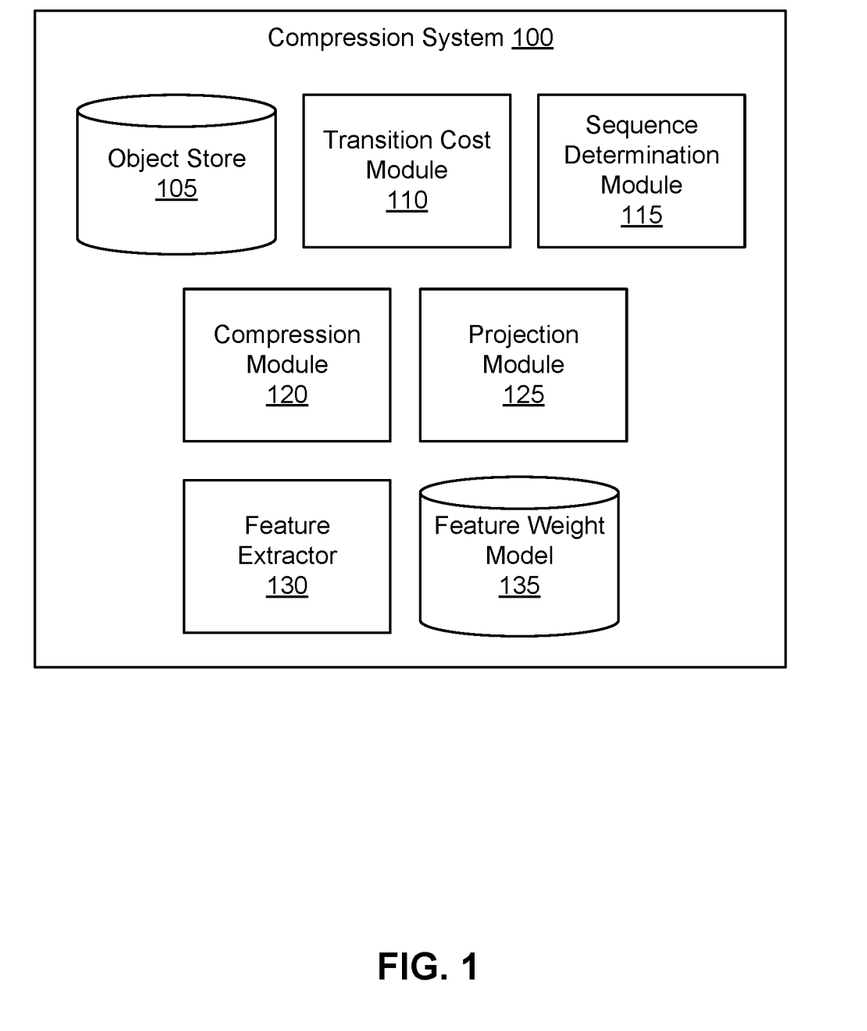

FIG. 1 is a high-level block diagram of a system architecture of a compression system, in accordance with an embodiment. The compression system 100 includes various modules and data stores that facilitate ordering and compression of data sets. The compression system 100 includes an object store 105, a transition cost module 110, a sequence determination module 115, a compression module 120, a projection module 125, a feature extractor 130, and a feature weight model 135. Computer components such as web servers, network interfaces, security functions, load balancers, failover servers, management and network operations consoles, and the like are not shown so as to not obscure the details of the system architecture. Additionally, the compression system 100 may contain more, fewer, or different components than those shown in FIG. 1 and the functionality of the components as described herein may be distributed differently from the description herein.

The object store 105 stores objects (e.g., images) for compression. Other possible formats for objects may include information in audio, text, or video. The object store 105 may store objects in data sets for which all members of a set are meant to be compressed together. In some embodiments, the object store 105 may also include disparate objects that are then grouped together into a set for compression. Data sets in the object store 105 may comprise unordered or ordered objects. When the order of the objects within a data set is relevant to later retrieval or use of the data set, the objects may include index values or another type of identifier such that the objects can be reordered for compression and such that their original ordering can be restored upon decompression. In some embodiments, the object store 105 may additionally store compressed data sets.

The transition cost module 110 generates transition costs associated with transitions between objects in data sets from the object store 105. A transition cost may be a value representative of a change from one object to another object, and typically is expected to reflect differences in compression when the objects are sequentially compressed. For example, a transition cost could be represented by a number of pixels that are different between two images, or by a number of bits of data that differ between representations of the two images in memory. In some embodiments, the transition cost module 110 stores the transition costs for a data set as a cost matrix. More information about the transition cost module 110 and cost matrices is included in the description of FIG. 2.

The sequence determination module 115 determines an order in which to compress objects from a data set. The sequence determination module 115 uses information generated by the transition cost module 110 to produce an ordering for a data set. The determined ordering is one in which the sum of the transition costs is reduced (and ideally, minimized) as the objects transition in the ordered sequence.

To determine an ordered sequence, the sequence determination module 115 may treat a cost matrix generated by the transition cost module 110 as a weighted, directed graph, in which objects are represented by nodes of the graph and edge weights represent the transition cost of transitioning between objects. The sequence determination module 115 may apply an algorithm, such as a Travelling Salesperson Problem (TSP) solver to determine an ordering of objects for which the total transition cost is minimized. In various embodiments, other algorithms may be applied to determine the ordering, such as other NP-complete problem solvers. As one way to use another problem solver, the directed graph may be projected into another type of NP-complete problem (e.g., translated into that type of problem), solved in that problem space and then projected back to an ordering of the directed graph. As one example, the directed graph may be projected to a Boolean satisfiability problem (SAT), solved with an SAT solver, and projected back to an ordering of the directed graph.

The compression module 120 applies a compression algorithm to the ordered data set. In some embodiments, the compression algorithm uses delta encoding to compress the ordered data set by saving the differences between subsequent objects. For example the compression module 120 may save a first image and information about the placement and difference in color values of pixels that differ in subsequent images. Once a data set is compressed, it may be stored in the object store 105, stored elsewhere on the compression system 100, or may be transmitted to another system for storage, decompression, or analysis.

In some cases, it may be computationally unfeasible to generate an ordering that minimizes the total transition cost of transitioning through all objects in a data set. To make the process of ordering data sets more practicable at scale, a projection module 125 generates estimations of optimal orderings. The projection module 125 accepts feature values associated with objects as input. In some embodiments, the projection module 125 projects the many feature values for each object in a data set onto a space filling curve (e.g., Hilbert curve, Peano Curve, Z-order curve, etc.). By projecting a multi-dimensional representation of an object (that is, the multiple feature values) onto a multi-dimensional space-filling curve, the projection module 125 generates a scalar representation of the object. When the projection module 125 generates such a projection for each object in a data set, the scalar representations of the objects, which may be related to their projected positions along the space filling curve, can be used as an ordering of the data set for which similar objects are near to each other. Space filling curves can preserve locality within a data set such that data points with similar distances along the curve have a similar spatial locality. That is—as illustrated in the simple space filling curve of FIG. 4B—points that are a similar distance along the one-dimensional curve are also near to each other within the multi-dimensional space (i.e., spatial locality). Since the position of an object's projection is determined by its feature values, objects with similar features will tend to have a similar spatial locality in the projection space (and a reduced transition cost is more likely when transitioning between objects with similar features). Data sets ordered by the projection module 125 are subsequently compressed by the compression module 120 using the determined ordering.

The feature extractor 130 extracts feature information from objects. The feature information may be provided as input to the projection module 125. In some embodiments, features associated with objects may be preprogrammed into the feature extractor 130. In the case of images, for example a data set of images of human faces, the feature extractor 130 may determine values associated with various image features such as background color, size and placement of the figure within the frame, shirt color, whether or not the figure is wearing glasses, and so forth. To extract features, the feature extractor 130 may use various analysis techniques that are appropriate to the relevant data type. For example, the feature extractor 130 may use image processing techniques such as convolutional neural networks to determine feature values associated with images in a data set.

In some embodiments, the compression system 100 trains computer models to generate weights to associate with different features. Projections made by the projection module 125 may produce better orderings when certain features are provided as input or when certain input features are emphasized. Similarly, some input feature values may prove irrelevant to the final ordering of a data set by the projection module 125. To emphasize useful feature values and deemphasize detrimental or inconsequential feature values, a feature weight model 135 is trained to generate weighting values for the features. In various embodiments, the feature weight model 135 may be trained using gradient descent, simulated annealing, genetic algorithms, and other training algorithms. The feature weight model 135 is trained using training data sets that have been optimally ordered (e.g., using a TSP solver or an equivalent algorithm) and that are labeled with known feature values. Using the training data, the feature weight model 135 may be trained to generate feature weights by which certain features should be adjusted before their values are input to the projection module 125. The feature weight model 135 may also be trained to generate feature weights in view of different projection algorithms that the projection module 125 will apply to the feature values. In some embodiments, the compression system 100 may have multiple feature weight models 135 for use with different data formats.

In alternative embodiments, the compression system 100 may train machine models to produce an estimated optimal ordering when given a data set. That is, the compression system 100 may train a computer model to probabilistically determine an optimal ordering for a data set. Such models may be generated using training data that includes optimally ordered data sets in which objects are labeled with feature values.

Figure 2:
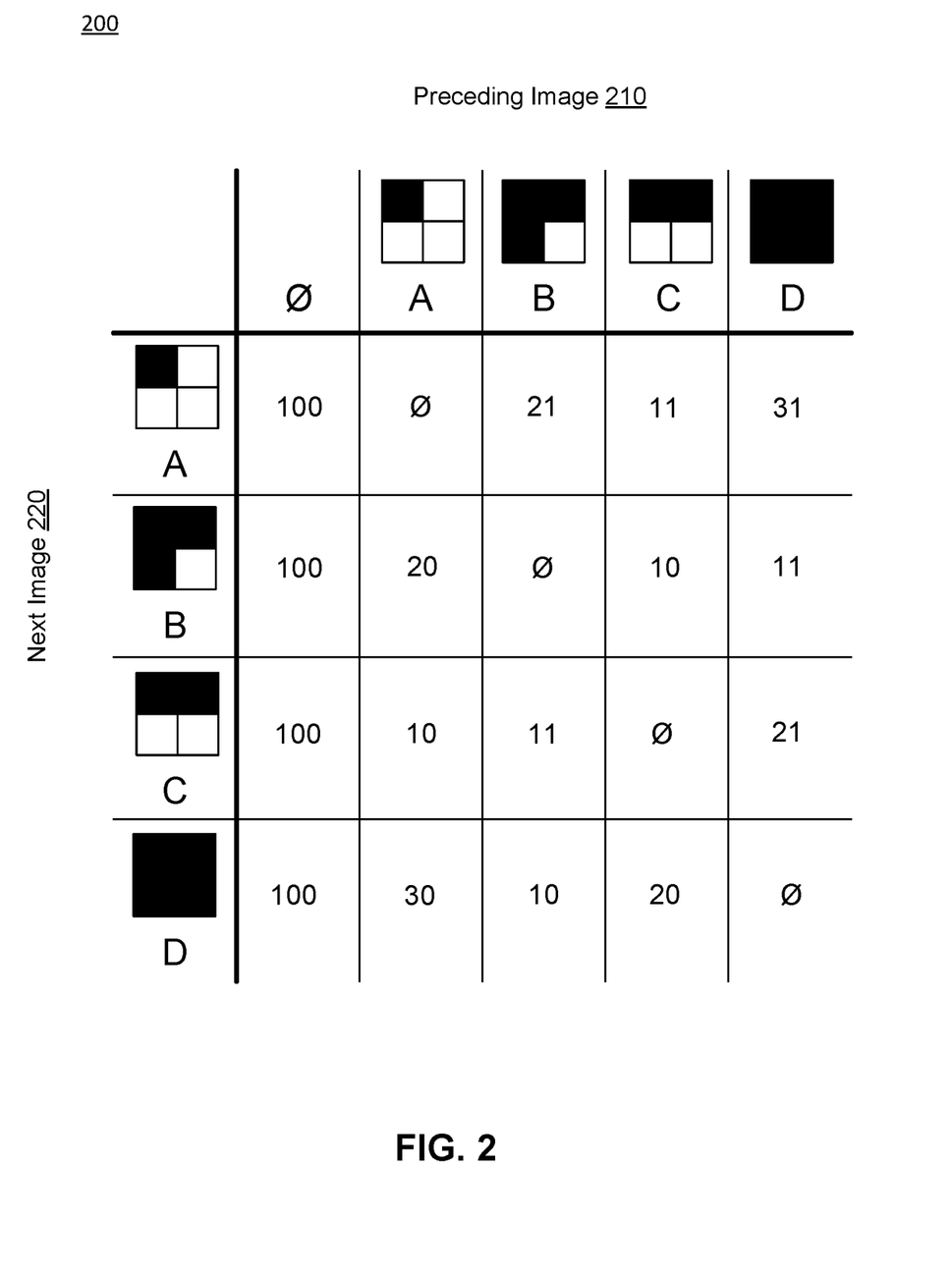
FIG. 2 illustrates an example cost matrix, in accordance with an embodiment.

FIG. 2 illustrates an example cost matrix, in accordance with an embodiment. Cost matrices are one way to represent transition cost data as is generated by the transition cost module 110. The cost matrix 200 shown in FIG. 2 charts the cost of transitioning from a preceding image 210 to a next image 220 for a data set of four example images (A, B, C, and D). For example, FIG. 2 shows that a transition cost of transitioning from image C to image B has a value of 10. The cost matrix 200 may also include the cost of saving a first image (i.e., a cost of transitioning from nothing to each image) as is denoted by Ø in FIG. 2. In some embodiments, as represented in FIG. 2, costs of transitioning from a first image to a second image may be different from costs for transitioning from the second image to the first image. This may occur because some images may have more details, and thus more information, than other pictures. For example, if a first image is a black square and a second image is a cat, it will be more costly to transition from the first image to the second image, but less costly to transition from the second image to the first image. As described above with respect to FIG. 1, the sequence determination module 115 may use information from a cost matrix 200 to determine a minimized total cost of transitioning between all the objects in a data set.

Figure 3:
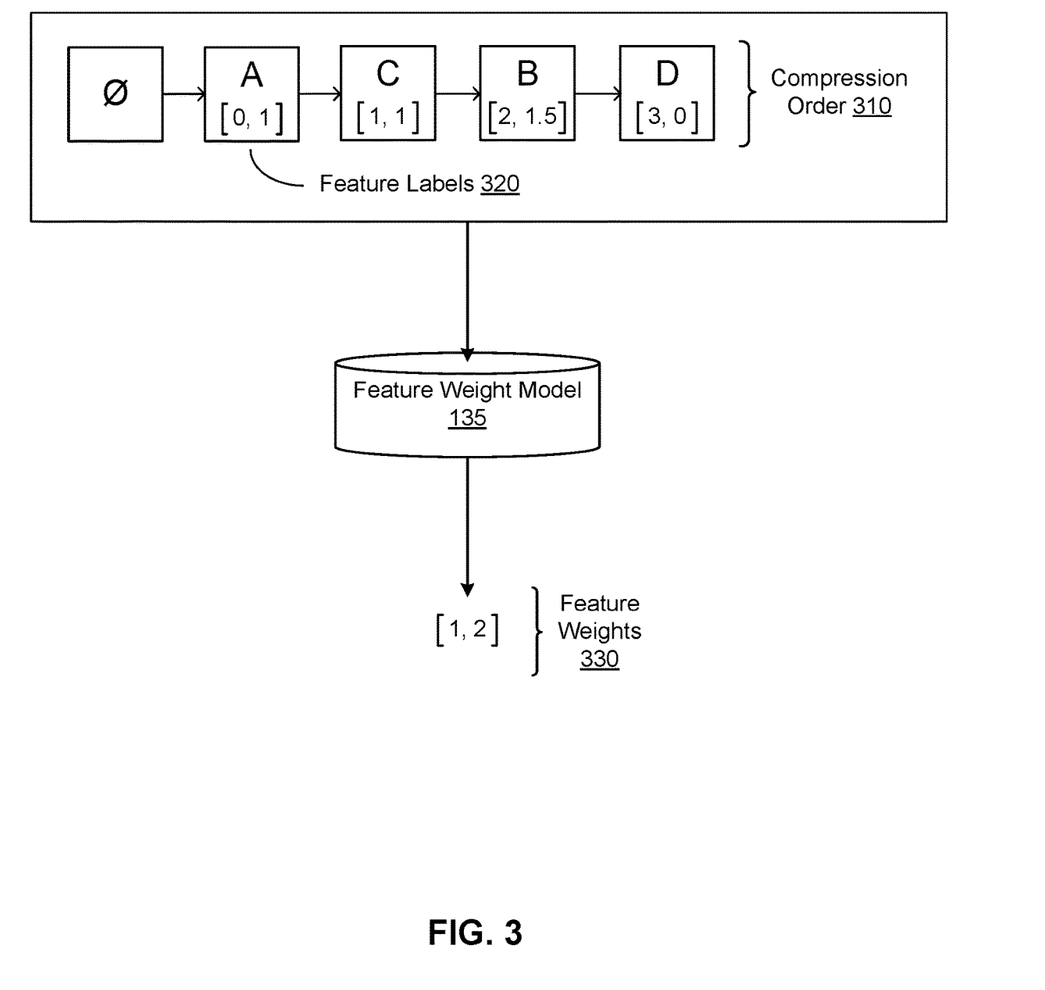
FIG. 3 illustrates an example process for training a model to determine feature weights, in accordance with an embodiment.

FIG. 3 illustrates an example process for training a model to determine feature weights, in accordance with an embodiment. Training data is provided to the feature weight model 135. The training data include an optimal compression order 310 of the objects in a data set and feature labels 320 identifying feature values associated with each of the objects.

Subsequent to training, the feature weight model 135 can produce feature weights 330 when given a new data set or when a type of data set is identified (e.g., a data format and associated features for which weights are needed). In one embodiment, the feature weight model 135 is trained to generate a weighting value for each feature type that is extracted for objects in a data set. In in the example of FIG. 3, two feature values were provided for each object and the feature weight model 135 generates a vector of two feature weights 330, e.g., [1, 2].

Figure 4A:
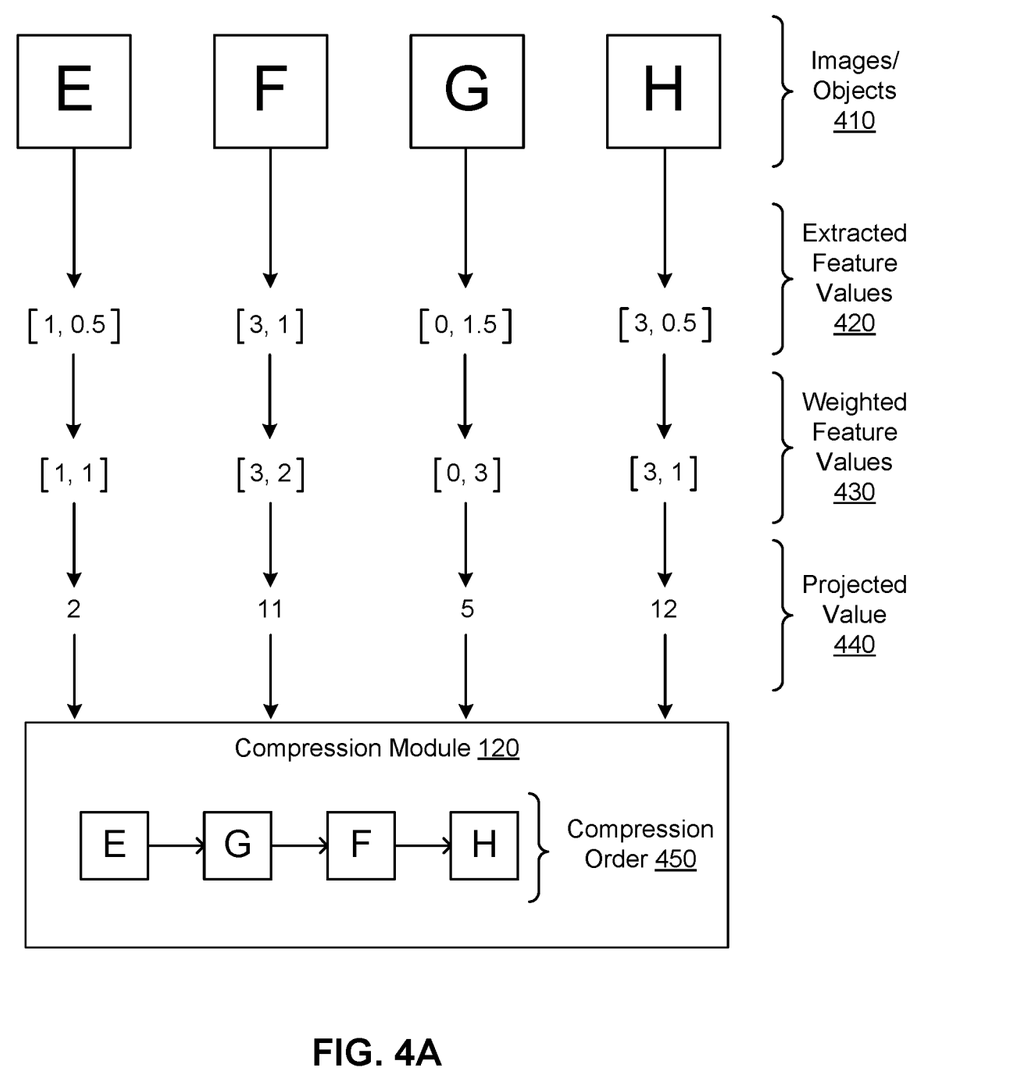
FIG. 4A illustrates an example process for determining an optimal compression order using extracted feature values, in accordance with an embodiment.

FIG. 4A illustrates an example process for determining an optimal compression order using extracted feature values, in accordance with an embodiment. In the example a compression order 450 is determined for four objects 410 (e.g., E, F, G, and H). The feature extractor 130 extracts feature values 420 from each of the objects 410. The extracted feature values 320 may then be adjusted in view of feature weights 330 as may be generated by the feature weight model 135. For example, in FIG. 4A, the feature values are multiplied by the feature weights. The weighted feature values 430 are provided as input to the projection module 125. The projection module 125 produces a projected value 440 associated with each object 410 and a compression order 450 is determined based on the projected values 440. For example, the compression order in FIG. 4A, is determined based on a numeric ordering of the projected values 440.

Figure 4B:
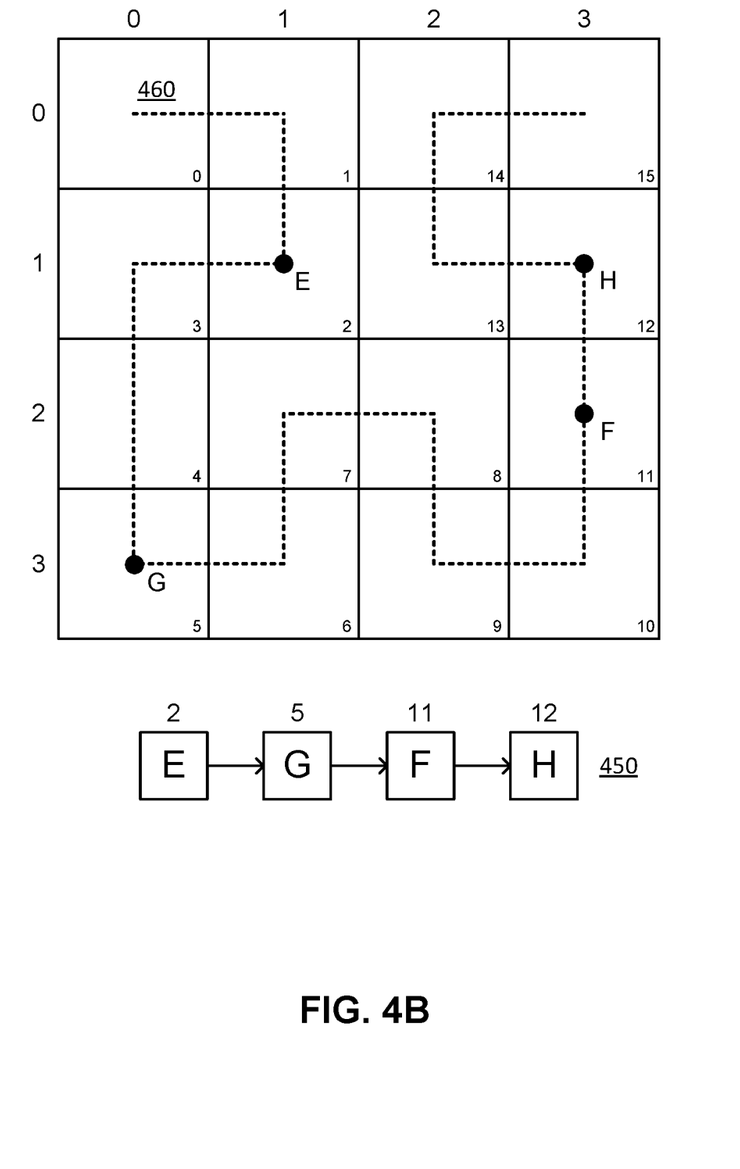
FIG. 4B illustrates a projection of weighted feature values onto a space-filling curve, in accordance with an embodiment.

FIG. 4B illustrates a projection of weighted feature values onto a space-filling curve, in accordance with an embodiment. In particular, FIG. 4B demonstrates how weighted feature values 430 for the objects 410 from FIG. 4A may be projected onto a space filling curve. The space filling curve 460 of FIG. 4B is represented by a dotted line. Since the example objects of FIG. 4A include two dimensions of features, that is, each of the objects 410 are represented by two feature values, the corresponding space filling curve 460 of FIG. 4B fills a two dimensional space. The space filling curve 460 fills the space in that it traverses each of the sixteen boxes into which the space is divided.

In various embodiments, the projection module 125 may use different projection algorithms for producing scalar values from the weighted feature values associated with objects. In the example of FIG. 4B, each of the sixteen boxes into which the space is divided can be referenced by a unique coordinate pair. The example projection algorithm uses the weighted feature values 430 as coordinates such that each object 410 is associated with the corresponding box. For example, in FIG. 4A, object G is determined to have weighted feature values of [0, 3]. In FIG. 4B, G is represented at coordinates 0 and 3.

The projected position of an object 410 along the space filling curve 460 determines its position in a compression order 450 for the objects 410. In the illustration of FIG. 4B, each of the sixteen boxes is labeled in the bottom right corner according to the order in which the space filling curve passes through the boxes (e.g., from box 0 to box 15). Object G, for example, is projected into box 5. In the example, the number of the box into which an object 410 is projected is a scalar value that represents the object 410 with respect to the other objects 410. More generally, the placement of an object within an n-dimensional space according to a weighted feature vector of length n determines a scalar value that corresponds to the position of the object 410 along the length of a space filling curve 460. The objects are sorted into a compression order 450 based on the order in which they are projected along the space filling curve 460. Equivalently, the objects 410 are ordered for compression in view of the scalar value associated with each object 410. In the example of FIG. 4B, a compression order of E, G, F, H is determined for the images because of their respective scalar values: 2, 5, 11, 12.

Figure 5:
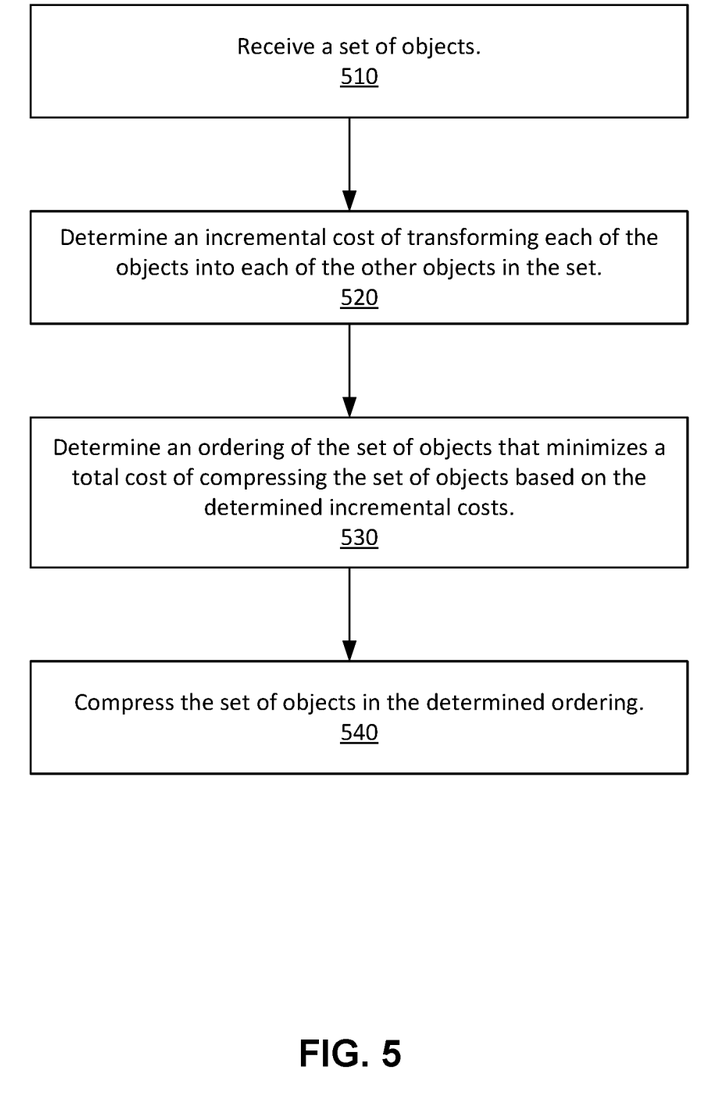
FIG. 5 is a flowchart illustrating a method of generating a compression order for a set of objects, in accordance with an embodiment.

FIG. 5 is a flowchart illustrating a method of generating a compression order for a set of objects, in accordance with an embodiment. The compression system 100 receives 510 a set of objects for compression. Such data sets may be saved in the object store 105. To optimally compress the data set, the compression system 100 determines 520 an incremental cost of transforming each of the objects into each of the other objects in the data set. That is, the compression system 100 determines transition costs associated with the objects in a data set as may be represented, for example, by a cost matrix. The compression system 100 further determines 530 an ordering of the objects in the data set that minimizes a total cost of compressing the set of objects based on the determined incremental costs and compresses 540 the set of objects in the determined ordering.

In another embodiment, the compression system 100 receives a set of objects for compression and extracts feature values from each of the objects. The compression system 100 generates weighting values using a model that is trained to determine weighting values for different features associated with objects. The feature values associated with each object are adjusted according to the weighting values. A projection algorithm is applied to convert the vectors of weighted feature values into scalar values that represent the objects, for example, by projecting the weighted feature values along a space filling curve. Based on the determined scalar values, an ordering that estimates a minimized total cost of compressing the set of objects in view of incremental costs is determined. The compression system 100 compresses the set of objects in the determined ordering.

In still another embodiment, the compression system 100 trains a predictive model to generate an ordering for a set of objects that will estimate minimizing a total cost of compressing the set of objects based on incremental costs. The compression system 100 extracts feature values for objects in a data set and provides the feature values as inputs to the predictive model. The predictive model produces an ordering for the set of objects and the compression system 100 compresses the set of objects in the produced ordering.

Figure 6:
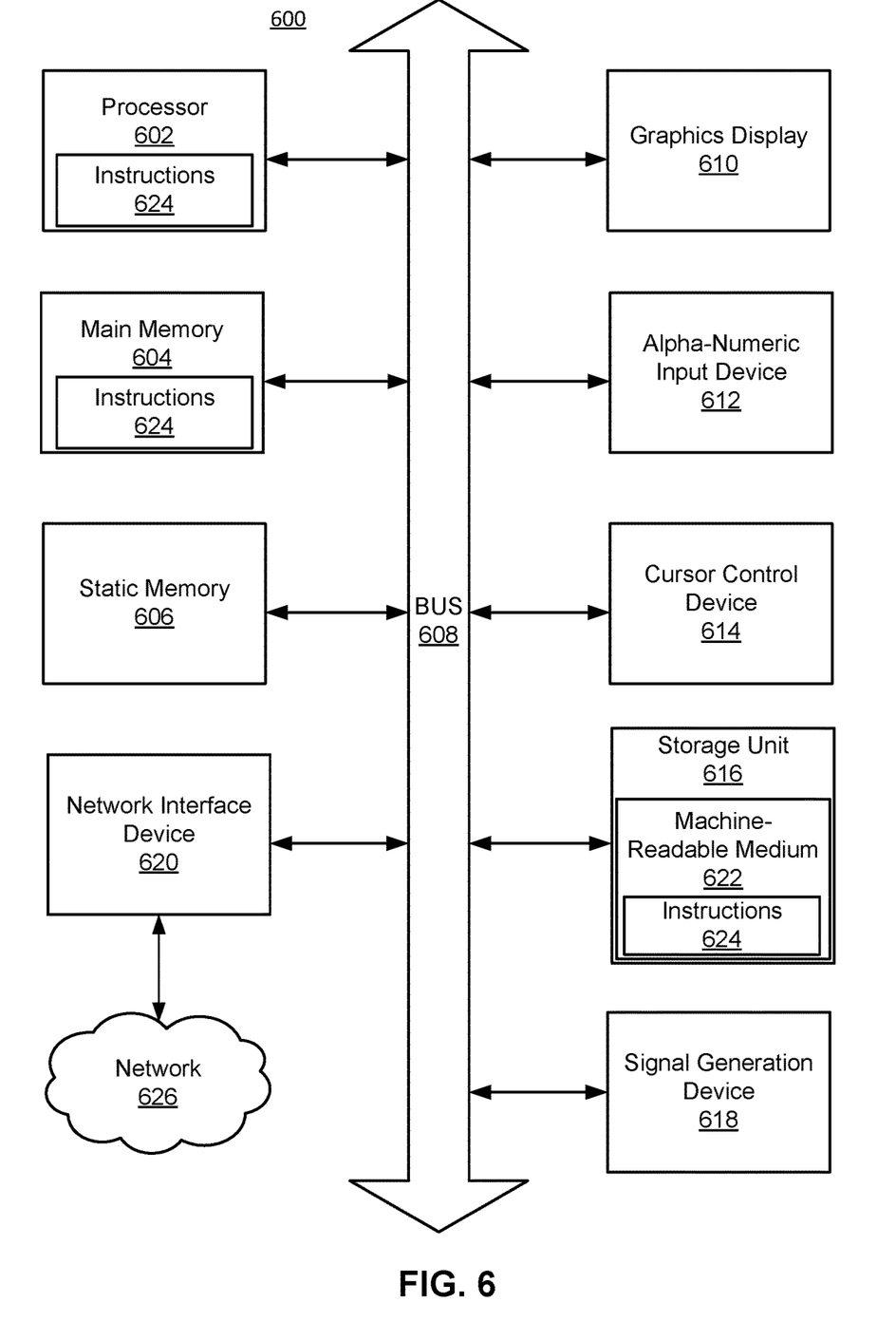
FIG. 6 is a block diagram illustrating components of an example machine for reading and executing instructions from a machine-readable medium, in accordance with an embodiment.

FIG. 6 is a block diagram illustrating components of an example machine for reading and executing instructions from a machine-readable medium. Specifically, FIG. 6 shows a diagrammatic representation of system 100 in the example form of a computer system 600. The computer system 600 can be used to execute instructions 624 (e.g., program code or software) for causing the machine to perform any one or more of the methodologies (or processes) described herein. In alternative embodiments, the machine operates as a standalone device or a connected (e.g., networked) device that connects to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), a tablet PC, a set-top box (STB), a smartphone, an internet of things (IoT) appliance, a network router, switch or bridge, or any machine capable of executing instructions 624 (sequential or otherwise) that specify actions to be taken by that machine. Further, while only a single machine is illustrated, the term "machine" shall also be taken to include any collection of machines that individually or jointly execute instructions 624 to perform any one or more of the methodologies discussed herein.

The example computer system 600 includes one or more processing units (generally processor 602). The processor 602 is, for example, a central processing unit (CPU), a graphics processing unit (GPU), a digital signal processor (DSP), a controller, a state machine, one or more application specific integrated circuits (ASICs), one or more radio-frequency integrated circuits (RFICs), or any combination of these. The computer system 600 also includes a main memory 604. The computer system may include a storage unit 616. The processor 602, memory 604, and the storage unit 616 communicate via a bus 608.

In addition, the computer system 600 can include a static memory 606, a graphics display 610 (e.g., to drive a plasma display panel (PDP), a liquid crystal display (LCD), or a projector). The computer system 600 may also include alphanumeric input device 612 (e.g., a keyboard), a cursor control device 614 (e.g., a mouse, a trackball, a joystick, a motion sensor, or other pointing instrument), a signal generation device 618 (e.g., a speaker), and a network interface device 620, which also are configured to communicate via the bus 608.

The storage unit 616 includes a machine-readable medium 622 on which is stored instructions 624 (e.g., software) embodying any one or more of the methodologies or functions described herein. For example, the instructions 624 may include the functionalities of modules of the compression system 100 described in FIG. 1. The instructions 624 may also reside, completely or at least partially, within the main memory 604 or within the processor 602 (e.g., within a processor's cache memory) during execution thereof by the computer system 600, the main memory 604 and the processor 602 also constituting machine-readable media. The instructions 624 may be transmitted or received over a network 626 via the network interface device 620.

While machine-readable medium 622 is shown in an example embodiment to be a single medium, the term "machine-readable medium" should be taken to include a single medium or multiple media (e.g., a centralized or distributed database, or associated caches and servers) able to store the instructions 624. The term "machine-readable medium" shall also be taken to include any medium that is capable of storing instructions 624 for execution by the machine and that cause the machine to perform any one or more of the methodologies disclosed herein. The term "machine-readable medium" includes, but not be limited to, data repositories in the form of solid-state memories, optical media, and magnetic media.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A computer-implemented method comprising:
   receiving a set of objects to be compressed;
   for each object in the set of objects:
      determining an incremental cost of transforming the object into each of the other objects in the set of objects according to a compression algorithm;
   determining an ordering of the set of objects that optimizes for a reduced total cost of compressing the set of objects based on the incremental cost of transforming each object in the ordering to a next object in the ordering;
   receiving feature values associated with each object in the set of objects, wherein a feature value is a descriptor of the content of the object;
   training a model to generate feature weights based on the ordering of the objects and based on the feature values associated with each object; and
   compressing the set of objects in the determined ordering using the compression algorithm.

2. The computer-implemented method of claim 1, wherein the compression algorithm includes saving the incremental changes between the objects in the set of objects in the determined order.

3. The computer-implemented method of claim 1, further comprising:
   receiving a second set of objects to be compressed;
   generating feature weights using the model;
   for each object in the second set of objects:
      extracting a set of feature values associated with the object;
      adjusting the feature values using the generated feature weights;
      determining, using the adjusted set of feature values associated with the object, a single value representative of the object;
   determining an order for compressing the second set of objects, the order based on the determined single values representative of each of the objects; and
   compressing the second set of objects in the determined ordering.

4. The computer-implemented method of claim 3, wherein determining a single value representative of the object comprises applying a projection algorithm to the adjusted feature values such that they positioned along a space filling curve, the single value representative of the object being proportional to the distance of the projected position along the length of the space filling curve.

5. The computer-implemented method of claim 3, wherein the compression algorithm includes saving the incremental changes between the objects in the set of objects in the determined order.

6. The computer-implemented method of claim 1, wherein a travelling salesperson problem solver is used for determining an ordering of the set of objects that optimizes for a reduced total cost of compressing the set of objects, wherein the objects represent nodes in a graph to which the solver is applied and the incremental costs of transforming each object in the ordering to a next object in the ordering represent weighted directed edges in the graph.

7. A computer-implemented method comprising:
   receiving a set of objects to be compressed;
   for each object in the set of objects:
      extracting a set of feature values, the feature values describing characteristics of the content of the object;
      generating weighting values for each feature of the set of feature values using a computer model;
      adjusting the feature values using the weighting values; and
      determining, by applying a projection function to the set of adjusted feature values, a single value representative of the object;
   determining an order for compressing the objects, the order based on the determined single values representative of each of the objects; and
   compressing the set of objects in the determined ordering.

8. The computer-implemented method of claim 7, wherein determining a single value representative of an object comprises projecting the feature values onto a space-filling curve.

9. The computer-implemented method of claim 8, wherein determining an order for compressing the objects based on the determined single values representative of each of the objects comprises ordering the single values in the same order that the projections occur along the space filling curve.

10. The computer-implemented method of claim 7, wherein a trained computer model is applied to determine a single value representative of the object and wherein determining the order for compressing the objects comprises ordering the objects in numerical order of the determined representative values.

11. The computer-implemented method of claim 7, wherein compressing the set of objects comprises applying a compression algorithm to the set of objects, wherein the compression algorithm includes saving the incremental changes between the objects in the set of objects in the determined order.

12. A non-transitory computer-readable storage medium storing computer program instructions executable by one or more processors of a system to perform steps comprising:
receiving a set of objects to be compressed;
for each object in the set of objects:
determining an incremental cost of transforming the object into each of the other objects in the set of objects according to a compression algorithm;
determining an ordering of the set of objects that optimizes for a reduced total cost of compressing the set of objects based on the incremental cost of transforming each object in the ordering to a next object in the ordering;
receiving feature values associated with each object in the set of objects, wherein a feature value is a descriptor of the content of the object;
training a model to generate feature weights based on the ordering of the objects and based on the feature values associated with each object; and
compressing the set of objects in the determined ordering using the compression algorithm.

13. The non-transitory computer-readable storage medium of claim 12, wherein the compression algorithm includes saving the incremental changes between the objects in the set of objects in the determined order.

14. The non-transitory computer-readable storage medium of claim 12, the steps further comprising:
receiving a second set of objects to be compressed;
generating feature weights using the model;
for each object in the second set of objects:
extracting a set of feature values associated with the object;
adjusting the feature values using the generated feature weights;
determining, using the adjusted set of feature values associated with the object, a single value representative of the object;
determining an order for compressing the second set of objects, the order based on the determined single values representative of each of the objects; and
compressing the second set of objects in the determined ordering.

15. The non-transitory computer-readable storage medium of claim 14, wherein determining a single value representative of the object comprises applying a projection algorithm to the adjusted feature values such that they positioned along a space filling curve, the single value representative of the object being proportional to the distance of the projected position along the length of the space filling curve.

16. The computer-implemented method of claim 14, wherein the compression algorithm includes saving the incremental changes between the objects in the set of objects in the determined order.

17. The non-transitory computer-readable storage medium of claim 12, wherein a travelling salesperson problem solver is used for the step of determining an ordering of the set of objects that optimizes for a reduced total cost of compressing the set of objects, wherein the objects represent nodes in a graph to which the solver is applied and the incremental costs of transforming each object in the ordering to a next object in the ordering represent weighted directed edges in the graph.

* * * * *

UNITED STATES PATENT AND TRADEMARK OFFICE
CERTIFICATE OF CORRECTION

PATENT NO. : 10,530,387 B1  
APPLICATION NO. : 16/167469  
DATED : January 7, 2020  
INVENTOR(S) : Bob Hansen Page 1 of 1

It is certified that error appears in the above-identified patent and that said Letters Patent is hereby corrected as shown below:

In the Claims

In Column 10, Claim 4, Line 33: "the adjusted feature values such that they positioned along a" to read as -- the adjusted feature values such that they are positioned along a --

In Column 12, Claim 15, Line 25-26: "the adjusted feature values such that they positioned along a" to read as -- the adjusted feature values such that they are positioned along a --

Signed and Sealed this  
Eighth Day of September, 2020

Andrei Iancu  
*Director of the United States Patent and Trademark Office*